(12) United States Patent
Yamaguchi et al.

(10) Patent No.: US 11,972,992 B2
(45) Date of Patent: Apr. 30, 2024

(54) SUBSTRATE FOR MOUNTING AN ELECTRONIC COMPONENT, ELECTRICAL DEVICE, AND LIGHT-EMITTING DEVICE

(71) Applicant: KYOCERA Corporation, Kyoto (JP)

(72) Inventors: Takafumi Yamaguchi, Kirishima (JP); Toshifumi Higashi, Kirishima (JP); Youji Furukubo, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 514 days.

(21) Appl. No.: 17/281,608

(22) PCT Filed: Jul. 17, 2019

(86) PCT No.: PCT/JP2019/028170
§ 371 (c)(1),
(2) Date: Mar. 31, 2021

(87) PCT Pub. No.: WO2020/070946
PCT Pub. Date: Apr. 9, 2020

(65) Prior Publication Data
US 2021/0391687 A1    Dec. 16, 2021

(30) Foreign Application Priority Data
Oct. 4, 2018   (JP) .................................. 2018-189292

(51) Int. Cl.
| H01S 5/023 | (2021.01) |
| H01L 23/13 | (2006.01) |
| H01S 5/022 | (2021.01) |
| H01S 5/02208 | (2021.01) |
| H01S 5/024 | (2006.01) |

(52) U.S. Cl.
CPC .............. *H01L 23/13* (2013.01); *H01S 5/022* (2013.01); *H01S 5/02208* (2013.01); *H01S 5/023* (2021.01); *H01S 5/02469* (2013.01)

(58) Field of Classification Search
CPC ......... H01L 23/13; H01L 23/48; H01L 23/64; H01L 23/642; H01L 23/644; H01L 23/647; H01S 5/023
See application file for complete search history.

(56) References Cited

U.S. PATENT DOCUMENTS

| 2005/0135443 A1 | 6/2005 | Ayliffe | |
| 2011/0149601 A1* | 6/2011 | Jang .................... | H01L 25/0753 362/612 |
| 2015/0357254 A1 | 12/2015 | Mikami | |

FOREIGN PATENT DOCUMENTS

| JP | 2003-124408 A | 4/2003 |
| JP | 2006-196505 A | 7/2006 |
| JP | 2011-040534 A | 2/2011 |
| JP | 2015-231009 A | 12/2015 |

* cited by examiner

*Primary Examiner* — Robert G Bachner
*Assistant Examiner* — Molly K Reida
(74) *Attorney, Agent, or Firm* — Volpe Koenig

(57) ABSTRACT

A substrate for mounting an electronic component according to an aspect of an embodiment includes a base that is a plate-shaped body, where a first surface of the base is sloped relative to a second surface that is opposed to the first surface, and when the base is bisected into a lower part and a higher part in a slope direction thereof, a thermal conductivity of the lower part is higher than a thermal conductivity of the higher part.

19 Claims, 5 Drawing Sheets

SUBSTRATE FOR MOUNTING AN ELECTRONIC COMPONENT, ELECTRICAL DEVICE, AND LIGHT-EMITTING DEVICE

CROSS-REFERENCE TO RELATED APPLICATIONS

This application is a national stage application of International Application No. PCT/JP2019/028170, filed on Jul. 17, 2019, which designates the United States, the entire contents of which are herein incorporated by reference, and which is based upon and claims the benefit of priority to Japanese Patent Application No. 2018-189292, filed on Oct. 4, 2018, the entire contents of which are herein incorporated by reference.

FIELD

A disclosed embodiment(s) relate(s) to a substrate for mounting an electronic component, an electrical device, and a light-emitting device.

BACKGROUND

A substrate for mounting an electronic component that is composed of a ceramic or the like has conventionally been disclosed as a housing for mounting an electronic component such as a semiconductor element, a light-emitting element, and a quartz oscillator (see, for example, Patent Literature 1).

CITATION LIST

Patent Literature

Patent Literature 1: Japanese Patent Application Publication No. 2015-231009

SUMMARY

A substrate for mounting an electronic component according to an aspect of the present embodiment has a base that is a plate-shaped body, wherein a first surface of the base is sloped relative to a second surface that is opposed to the first surface, and when one provided by bisecting the base in a slope direction thereof is provided as a lower part and another thereof is provided as a higher part, a thermal conductivity of the lower part is higher than a thermal conductivity of the higher part.

An electrical device in the present embodiment has the substrate for mounting an electronic component as described above, and an electronic component that is mounted on the first surface.

A light-emitting device in the present embodiment has the substrate for mounting an electronic component as described above, and a light-emitting element that is mounted on the first surface, wherein the substrate for mounting an electronic component has a dam part that is arranged so as to surround the light-emitting element on the first surface, and the dam part has an opening that penetrates through the first surface in a plane direction thereof.

DESCRIPTION OF EMBODIMENTS

Hereinafter, an aspect of a substrate for mounting an electronic component, an electrical device, and a light-emitting device in the present embodiment will be explained with reference to the accompanying drawings. Herein, it is possible to provide a semiconductor element, a light-emitting element, a quartz oscillator, or the like as an electronic component.

Figure 1:
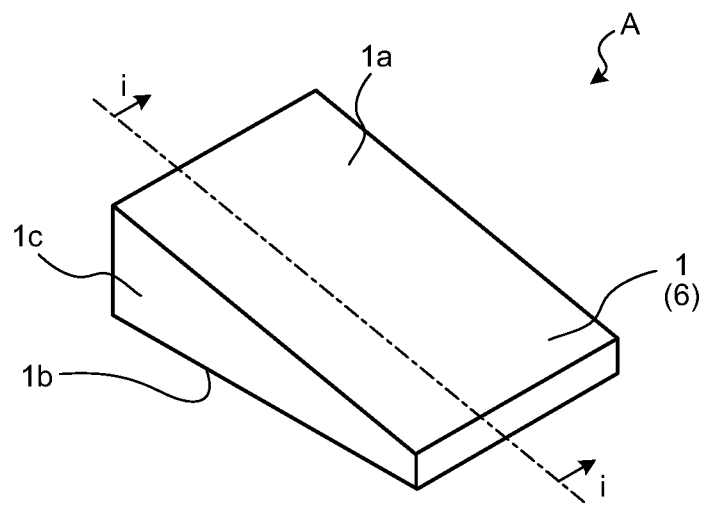
FIG. 1 is a perspective view that illustrates an example of a substrate for mounting an electronic component in the present embodiment.
Figure 2:
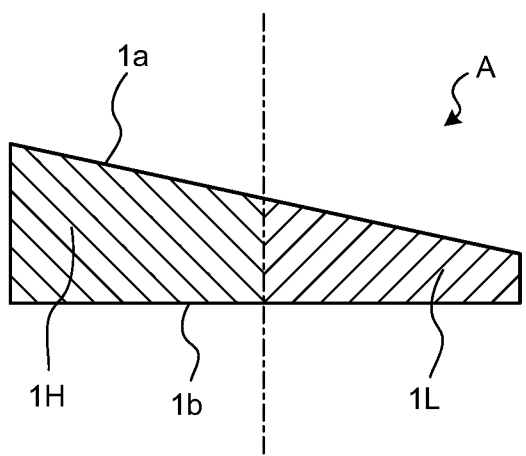
FIG. 2 is a cross-sectional view of FIG. 1 along line i-i thereof.

FIG. 1 is a perspective view that illustrates an example of a substrate for mounting an electronic component in the present embodiment. FIG. 2 is a cross-sectional view of FIG. 1 along line i-i thereof.

A substrate for mounting an electronic component A according to the present embodiment has a base 1 that is a plate-shaped body. Additionally, an example where the base 1 is composed of a base body 6 is illustrated in the present embodiment. An (non-illustrated) electronic component is mounted on a central part of a first surface 1a of the base 1.

As illustrated in FIG. 2, the first surface 1a of the base 1 is sloped relative to a second surface 1b of the base 1 that is opposed thereto. A slope angle of the first surface 1a relative to the second surface 1b may be about 5° to 45°. Furthermore, a slope of the first surface 1a relative to the second surface 1b does not have to be constant and a site with a different slope angle may be included therein. Hereinafter, as the base 1 is divided into two by a plane that is orthogonal to the second surface 1b in such a manner that a length of the first surface 1a in a slope direction thereof is bisected, one with a less average height is represented as a lower part 1L and one with a greater average height is represented as a higher part 1H.

Herein, an average height refers to an average value of a height of the first surface 1a relative to the second surface 1b. For measurement of a height, heights of the first surface 1a at ten or more points at constant intervals in a slope direction thereof may be measured.

Furthermore, in a case where lengths of line segments that connect ends and ends of the first surface 1a and are parallel to a slope direction of the first surface 1a are different (for example, in a case where the first surface 1a is of a triangular shape or the like), a greatest length of a line segment among such line segments is referred to as a length of the first surface 1a in a slope direction thereof.

In a case where the lower part 1L and the higher part 1H are defined as described above, heat that is generated from an electronic component that is mounted on a central part of the first surface 1a flows to the lower part 1L more readily than the higher part 1H from a viewpoint of a thermal resistance. In other words, an amount of a heat flow that passes through the lower part 1L tends to be greater than an amount of a heat flow that passes through the higher part 1H.

Hence, in a case where it is possible to increase a thermal conductivity of the lower part 1L or the higher part 1H selectively, a thermal conductivity of the lower part 1L has to be increased. That is, a thermal conductivity of the lower part 1L has to be higher than a thermal conductivity of the higher part 1H. An amount of a heat flow that passes through the lower part 1L tends to be greater than an amount of a heat flow that passes through the higher part 1H, so that it is possible to further improve a heat dissipation property of the substrate for mounting an electronic component A by increasing a thermal conductivity of the lower part 1L.

It is possible to measure thermal conductivities of the lower part 1L and the higher part 1H by, for example, dividing the base 1 into the lower part 1L and the higher part 1H in dicing and subsequently applying a laser flash method to each thereof. The first surface 1a is sloped relative to the second surface 1b by a certain amount or greater, so that, in a case where application of a laser flash method is difficult, measurement may be executed as follows. First, after the base 1 is divided into the lower part 1L and the higher part 1H by dicing, thermal transient analysis is executed for each thereof so as to measure thermal resistances of the lower part 1L and the higher part 1H. It is possible to execute thermal transient analysis regardless of a slope angle of the first surface 1a relative to the second surface 1b. Subsequently, measured thermal resistances of the lower part 1L and the higher part 1H are divided by average heights of the lower part 1L and the higher part 1H as described previous respectively, so as to obtain thermal resistances per unit height of the lower part 1L and the higher part 1H. It is possible to determine that a thermal conductivity of one with a lower thermal resistance per unit height is higher.

A ceramic material may mainly be applied to the base 1, and otherwise, a metallic material, an organic material, and a glass material may mainly be applied thereto. Furthermore, the base 1 may contain a plurality of kinds of materials as described above. Although it is possible to apply a variety of ceramics to the base 1, aluminum nitride (AlN) may be included as a main component in that it has a high thermal conductivity.

Herein, "including aluminum nitride as a main component" refers to the base 1 that includes 80% by volume or more, and further, 90% by volume or more, of aluminum nitride. As the base 1 includes aluminum nitride (AlN) as a main component, it is possible to provide the substrate for mounting an electronic component A with a more excellent heat dissipation property.

Additionally, a conductor may be provided on an inside and a surface of the base 1 as needed in the substrate for mounting an electronic component A, although illustration thereof is not provided in FIG. 1 and FIG. 2.

Figure 3:
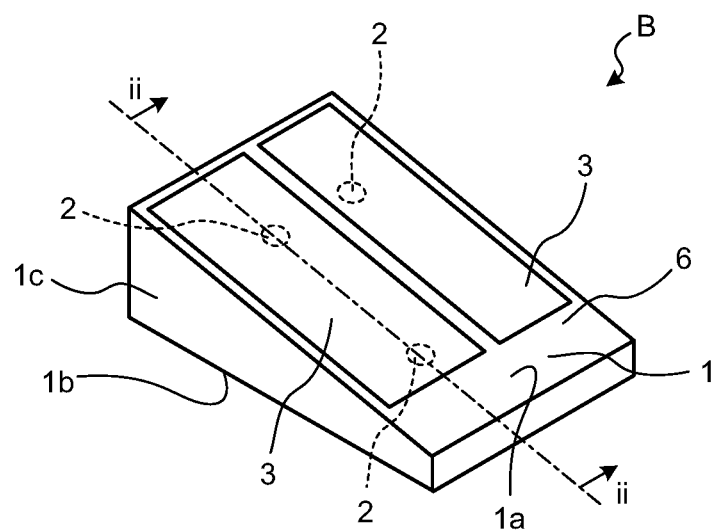
FIG. 3 is a perspective view of another aspect of a substrate for mounting an electronic component.
Figure 4:
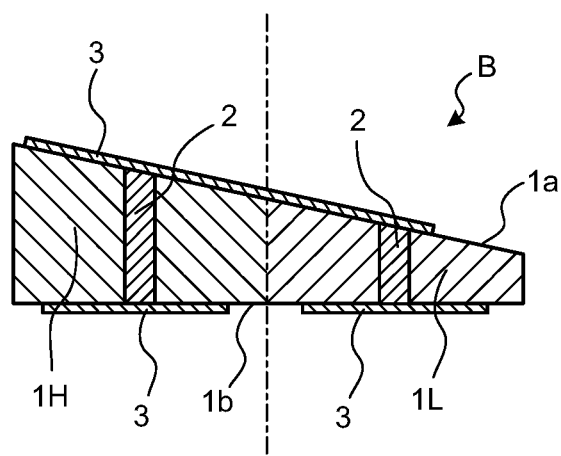
FIG. 4 is a cross-sectional view of FIG. 3 along line ii-ii thereof.

FIG. 3 is a perspective view that illustrates an example of a substrate for mounting an electronic component in an embodiment. FIG. 4 is a cross-sectional view of FIG. 3 along line ii-ii thereof.

A substrate for mounting an electronic component B as illustrated in FIG. 3 and FIG. 4 illustrates a mode of the substrate for mounting an electronic component A as described above where a common component will be provided with an identical sign so as to omit a detailed explanation thereof.

In the substrate for mounting an electronic component B, a base 1 has a base body 6, a via conductor 2, and a conductor pattern 3. The via conductor 2 is arranged inside the base 1 and the conductor pattern 3 is arranged on a first surface 1a and a second surface 1b of the base 1. The conductor pattern 3 may be arranged on a side surface 1c of the base 1.

For example, in a case where aluminum nitride (AlN) is mainly applied to the base body 6 in order to improve a heat dissipation property of the substrate for mounting an electronic component B, a thermal conductivity of the via conductor 2 may be lower than a thermal conductivity of the base body 6. In such a case, a number (volume) of a via conductor(s) 2 that is/are arranged on a lower part 1L may be less than a number (volume) of a via conductor(s) 2 that is/are arranged on a higher part 1H, as illustrated in FIG. 3. As described above, an amount of a heat flow that passes through the lower part 1L tends to be greater than an amount of a heat flow that passes through the higher part 1H, so that it is possible to further improve a heat dissipation property of the substrate for mounting an electronic component B by decreasing a number (decreasing a volume) of a via conductor(s) 2 that is/are arranged on the lower part 1L.

Furthermore, the via conductor 2 does not have to be arranged on the lower part 1L. That is, the via conductor 2 may be arranged on only the higher part 1H. Thus, it is possible to further improve a heat dissipation property of the substrate for mounting an electronic component B.

Aluminum nitride (AlN) is herein provided as a constituent material of the base body 6 illustratively, and otherwise, it is possible to apply a variety of materials to the base body 6.

On the other hand, in the substrate for mounting an electronic component B, a thermal conductivity of the via conductor 2 may be higher than a thermal conductivity of the base body 6. In such a case, a number (volume) of a via conductor(s) 2 that is/are arranged on the lower part 1L may be greater than a number (volume) of a via conductor(s) 2 that is/are arranged on the higher part 1H. Thus, it is possible to improve a heat dissipation property of the substrate for mounting an electronic component B.

Moreover, the via conductor 2 may be arranged on only the lower part 1L. Thus, it is possible to further improve a heat dissipation property of the substrate for mounting an electronic component B.

It is possible to measure thermal conductivities of the via conductor 2 and the base body 6 by using a laser flash method. In a case where application of a laser flash method is difficult due to a problem(s) in shapes and dimensions of the via conductor 2 and the base body 6, measurement may be executed as follows. For example, respective samples with shapes and dimensions that are suitable for a laser flash method are created by using a constituent material and a manufacturing method that are similar to those of the via conductor 2 and the base body 6. If thermal conductivities of such samples are measured, it is possible to measure thermal conductivities of the via conductor 2 and the base body 6. Herein, a similar constituent material refers to a composition that is identical in a range of at least one or more digits after a decimal point.

Meanwhile, in the substrate for mounting an electronic component B as described above, the base 1 contains a first material and a second material with a thermal conductivity that is lower than that of the first material. Herein, in a case where a thermal conductivity of the via conductor 2 is lower than a thermal conductivity of the base body 6, it is sufficient that the base body 6 is provided as a first material and the via conductor 2 is provided as a second material. On the other hand, in a case where a thermal conductivity of the via conductor 2 is higher than a thermal conductivity of the base body 6, it is sufficient that the via conductor 2 is provided as a first material and the base body 6 is provided as a second material.

Additionally, in a case where the base 1 does not have the via conductor 2, it is sufficient that a component with a greatest content (a main component) among components that compose the base body 6 and (an)other component(s) is/are provided as a first material or a second material, respectively, depending on thermal conductivities thereof.

Herein, a content rate (volume %) of a second material in the lower part 1L may be less than a content rate of the second material in the higher part 1H. In other words, a content rate (volume %) of a first material in the lower part 1L may be greater than a content rate of the first material in the higher part 1H. As described above, an amount of a heat flow that passes through the lower part 1L tends to be greater than an amount of a heat flow that passes through the higher part 1H. Hence, a content rate of a second material in the lower part 1L is less than a content rate of the second material in the higher part 1H, so that it is possible to further improve a heat dissipation property of the substrate for mounting an electronic component B.

A ceramic material may mainly be applied to the base body 6, and otherwise, a metallic material, an organic material, and a glass material may mainly be applied thereto. Furthermore, the base body 6 may contain a plurality of kinds of materials as described above. Although it is possible to apply a variety of ceramics to the base body 6, aluminum nitride (AlN) may be included as a main component in that it has a high thermal conductivity.

A variety of metallic materials, alloys, and composite materials are applied to the via conductor 2 and the conductor pattern 3. In a case where the base 1 contains aluminum nitride (AlN), a composite material of tungsten (W) and/or molybdenum (Mo) and aluminum nitride (AlN) may be applied thereto, in that it is possible to execute simultaneous firing thereof.

A plating film of Ni or the like may be formed on a surface of the conductor pattern 3. Moreover, solder and/or an Au—Sn plating film may be provided on a surface of such a plating film.

Figure 5:
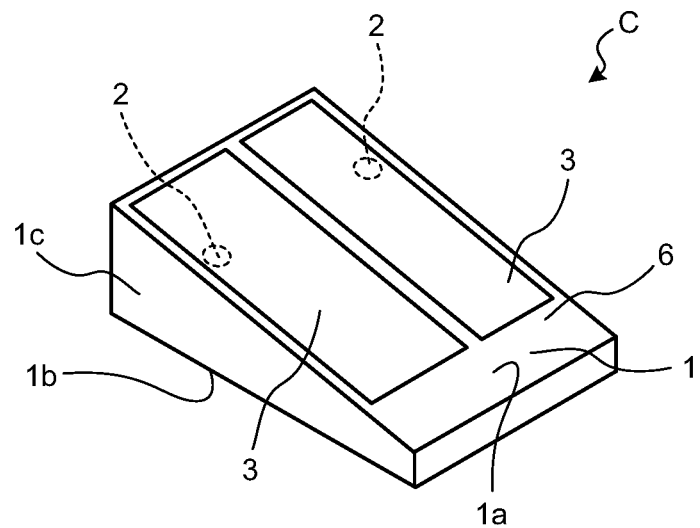
FIG. 5 is a perspective view of another aspect of a substrate for mounting an electronic component.
Figure 6:
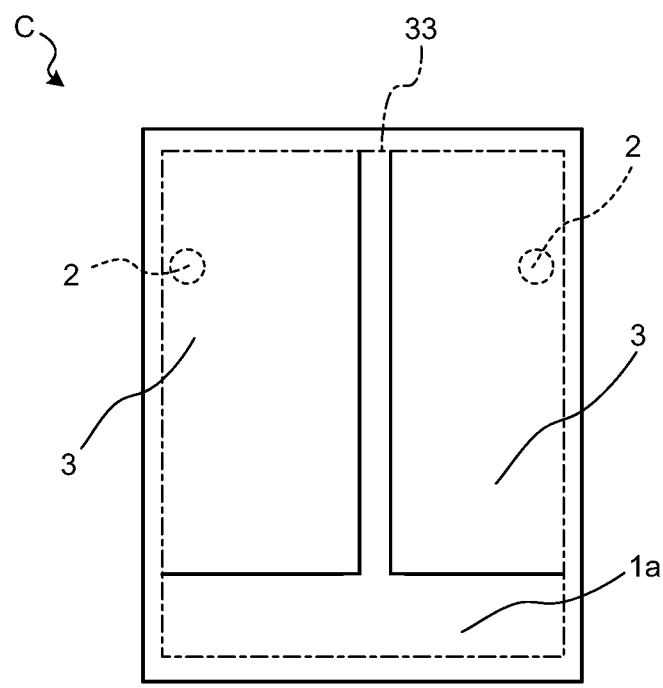
FIG. 6 is a plan view of a substrate for mounting an electronic component as illustrated in FIG. 5.
Figure 7:
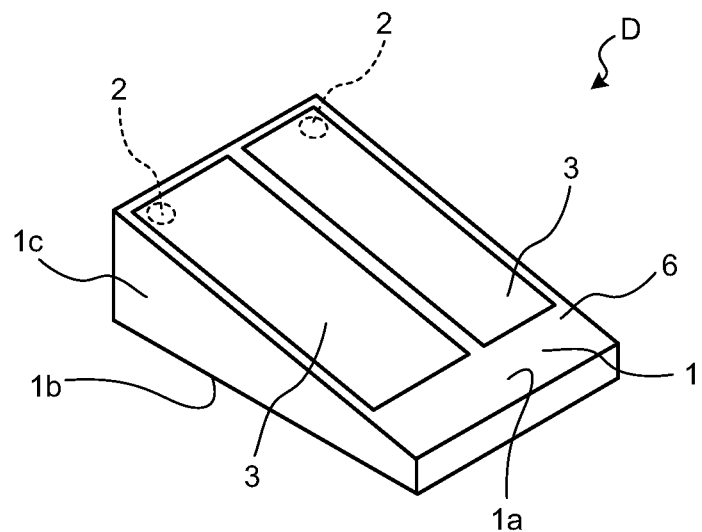
FIG. 7 is a perspective view of another aspect of a substrate for mounting an electronic component.

FIG. 5 and FIG. 7 are perspective views that illustrate an example of a substrate for mounting an electronic component in an embodiment. FIG. 6 is a plan view of FIG. 5. Substrates for mounting an electronic component C and D as illustrated in FIG. 5 to FIG. 7 illustrate modes of the substrate for mounting an electronic component B as described above where a common component will be provided with an identical sign so as to omit a detailed explanation thereof.

In the substrate for mounting an electronic component C as illustrated in FIG. 5, a via conductor 2 is arranged on only a peripheral part of a base 1 when a plan view thereof is provided. Thereby, it is possible to increase a distance from an electronic component that is a heat source to the via conductor 2. In a case where a thermal conductivity of the via conductor 2 is lower than a thermal conductivity of a base body 6, it is possible to improve a heat dissipation property of the substrate for mounting an electronic component C by executing arrangement of the via conductor 2 as described above.

Furthermore, in the substrate for mounting an electronic component D as illustrated in FIG. 7, a via conductor 2 is arranged on only a corner part of a base 1 when a plan view thereof is provided. Thereby, it is possible to further increase a distance from an electronic component that is a heat source to the via conductor 2. In a case where a thermal conductivity of the via conductor 2 is lower than a thermal conductivity of a base body 6, it is possible to further improve a heat dissipation property of the substrate for mounting an electronic component D by executing arrangement of the via conductor 2 as described above.

On the other hand, in a case where a thermal conductivity of the via conductor 2 is higher than a thermal conductivity of the base body 6, it is preferable that the via conductor 2 is arranged on only a central part of the base 1 when a plan view thereof is provided (non-illustrated). Thereby, it is possible to decrease a distance from an electronic component that is a heat source to the via conductor 2, so that it is possible to improve a heat dissipation property of the substrate for mounting an electronic component C.

Herein, "a peripheral part of a base" and "a central part of a base" will be explained below. A first surface 1a of the base 1 is divided into three regions depending on a distance from a center of gravity of a surface area of the first surface 1a. Herein, the first surface 1a may be divided in such a manner that a distance from a center of gravity of a surface area of the first surface 1a to an end of the first surface 1a is trisected. Among divided first surfaces 1a, an outermost region is provided as a peripheral region and an innermost region is provided as a central region. When a plan view of the base 1 is provided, the via conductor 2 that is arranged only directly below such a peripheral region is referred to as "a via conductor is arranged on only a peripheral part of a base when a plan view thereof is provided". Furthermore, when a plan view of the base 1 is provided, the via conductor 2 that is arranged only directly below such a central region is referred to as "a via conductor is arranged on only a central part of a base when a plan view thereof is provided".

Subsequently, "a corner part of a base" will be explained below. In the first surface 1a of the base 1, a region that is provided within a certain distance from each vertex of the first surface 1a is provided as a corner region. Herein, a certain distance may be ⅓ of a length of a line segment that connects each vertex of the first surface 1a and a center of gravity of a surface area of the first surface 1a. When a plan view of the base 1 is provided, the via conductor 2 that is arranged only directly below such a corner region is referred to as "a via conductor is arranged on only a corner part of a base when a plan view thereof is provided".

As illustrated in FIG. 5, in the substrate for mounting an electronic component C, the via conductor 2 is connected to a conductor pattern 3 on only a peripheral part of the conductor pattern 3 when a plan view thereof is provided. Also in such a case, it is possible to increase a distance from an electronic component that is a heat source to the via conductor 2. In a case where a thermal conductivity of the via conductor 2 is lower than a thermal conductivity of the base body 6, it is possible to improve a heat dissipation property of the substrate for mounting an electronic component C by executing arrangement of the via conductor 2 as described above.

Furthermore, as illustrated in FIG. 7, in the substrate for mounting an electronic component D, the via conductor 2 is connected to a conductor pattern 3 on only a corner part of the conductor pattern 3 when a plan view thereof is provided. Thereby, it is possible to further increase a distance from an electronic component that is a heat source to the via conductor 2. In a case where a thermal conductivity of the via conductor 2 is lower than a thermal conductivity of the base body 6, it is possible to further improve a heat dissipation property of the substrate for mounting an electronic component D by executing arrangement of the via conductor 2 as described above.

On the other hand, in a case where a thermal conductivity of the via conductor 2 is higher than a thermal conductivity of the base body 6, it is preferable that the via conductor 2 is connected to the conductor pattern 3 on only a central part of the conductor pattern 3 when a plan view thereof is provided (non-illustrated). Thereby, it is possible to decrease a distance from an electronic component that is a heat source to the via conductor 2, so that it is possible to improve a heat dissipation property of the substrate for mounting an electronic component C.

Herein, "a peripheral part of a conductor pattern" and "a central part of a conductor pattern" will be explained below. As illustrated in FIG. 6, a planar shape 33 is defined that surrounds a whole of the conductor pattern 3 and is similar to a shape of the first surface 1a of the base 1. A center of gravity of a surface area of the planar shape 33 is arranged so as to coincide with a center of gravity of a surface area of the first surface 1a. Furthermore, the planar shape 33 is provided as a minimum surface area that is capable of surrounding a whole of the conductor pattern 3. Herein, the planar shape 33 is divided into three regions depending on a distance from a center of gravity of a surface area of the planar shape 33. Herein, the planar shape 33 may be divided in such a manner that a distance from a center of gravity of a surface area of the planar shape 33 to an end of the planar shape 33 is trisected. Among divided planar shapes 33, an outermost region is provided as a peripheral region and an innermost region is provided as a central region. When a plan view of the base 1 is provided, the via conductor 2 that is connected to the conductor pattern 3 only directly below such a peripheral region is referred to as "a via conductor is connected to a conductor pattern on only a peripheral part of the conductor pattern when a plan view thereof is provided". Furthermore, when a plan view of the base 1 is provided, the via conductor 2 that is connected to the conductor pattern 3 only directly below such a central region is referred to as "a via conductor is connected to a conductor pattern on only a central part of the conductor pattern when a plan view thereof is provided".

Subsequently, "a corner part of a conductor pattern" will be explained below. In the planar shape 33 as described previously, a region that is provided within a certain distance from each vertex of the planar shape 33 is provided as a corner region. Herein, a certain distance may be ⅓ of a length of a line segment that connects each vertex of the planar shape 33 and a center of gravity of a surface area of the planar shape 33. When a plan view of the base 1 is provided, the via conductor 2 that is connected to the conductor pattern 3 only directly below such a corner region is referred to as "a via conductor is connected to a conductor pattern on only a corner part of the conductor pattern when a plan view thereof is provided".

Figure 8:
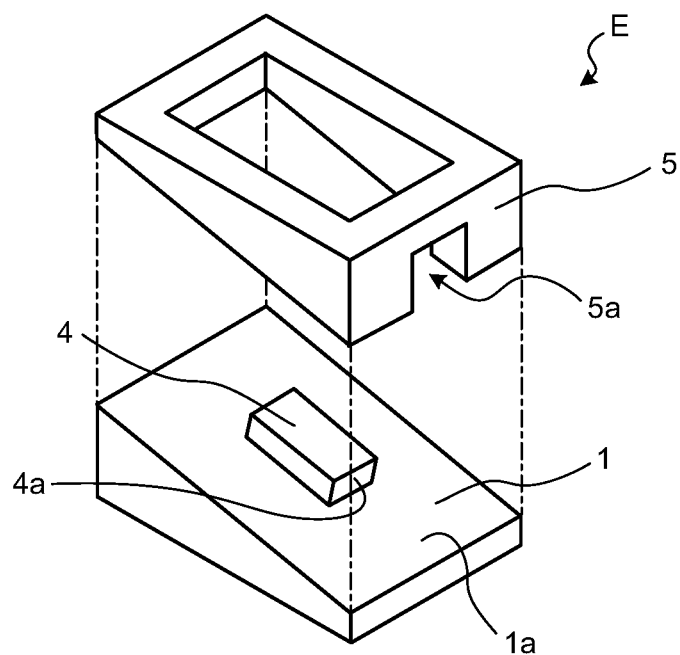
FIG. 8 is an exploded perspective view that illustrates an example of a light-emitting device in the present embodiment.

FIG. 8 is an exploded perspective view that illustrates a light-emitting device in an embodiment. For a light-emitting device E as illustrated in FIG. 8, it is possible to use any one of the substrates for mounting an electronic component A to D as described above.

As illustrated in FIG. 8, in the light-emitting device E, a light-emitting element 4 is mounted on a central part of a first surface 1a of a base 1. Additionally, it is possible to use, for example, a laser diode or the like as the light-emitting element 4. Moreover, a dam part 5 is arranged on the first surface 1a so as to surround the light-emitting element 4 that is mounted thereon. FIG. 8 conveniently illustrates the base 1 and the dam part 5 in a decomposed forms thereof. The dam part 5 has an opening 5a that penetrates through the first surface 1a in a plane direction thereof. The opening 5a is provided in order to emit light that is generated from the light-emitting element 4 to an outside of the light-emitting device E. Although a light-emitting surface 4a of the light-emitting element 4 is oriented downward in a slope direction of the first surface 1a in FIG. 8, the light-emitting surface 4a may be oriented upward in a slope direction of the first surface 1a.

In the light-emitting device E, the base 1 and the dam part 5 may be formed of a ceramic(s) integrally. If such a configuration is provided, an interface that is composed of a heterogeneous material and generates a high thermal resistance is not generated between the base 1 and the dam part 5 in the light-emitting device E. Thereby, it is possible to decrease a thermal resistance between the base 1 and the dam part 5, so that it is possible to improve a heat dissipation property of the light-emitting device E.

The light-emitting element 4 is bonded to a central part of the first surface 1a by using an electrically conductive bonding material such as solder. Herein, a (non-illustrated) first electrode that is provided on a lower surface of the light-emitting element 4 and a conductor pattern 3 may be electrically connected by such an electrically conductive bonding material.

A (non-illustrated) second electrode that is provided on an upper surface of the light-emitting element 4 and the conductor pattern 3 may be electrically connected by wire bonding or the like.

Also in a case where an electrical device is configured in such a manner that electronic components are mounted on central parts of first surfaces 1a of the substrates for mounting an electronic component A to D, such electronic components are electrically connected to conductor patterns 3 as described above.

Figure 9:
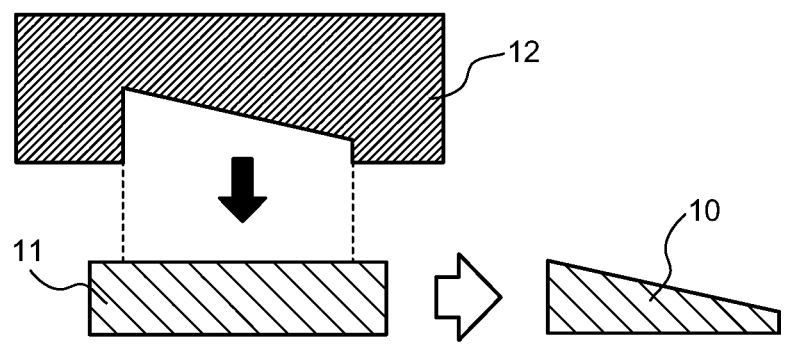
FIG. 9 is a cross-sectional view that illustrates a manufacturing process for a substrate for mounting an electronic component in the present embodiment.

Next, a manufacturing method for a substrate for mounting an electronic component according to each embodiment will be explained. FIG. 9 is a cross-sectional view that illustrates a manufacturing process for the substrate for mounting an electronic component A in an embodiment.

First, as illustrated in FIG. 9, a green sheet 11 that is preliminarily processed into a rectangular parallelepiped shape is prepared. Then, press processing is executed from an upper side to a lower side of the green sheet 11 by using a press die 12 so as to form a molded body 10 that provides the substrate for mounting an electronic component A. The press die 12 is processed into a predetermined shape in such a manner that a first surface of the molded body 10 that is obtained after a press thereof is sloped relative to a second surface that is opposed to the first surface.

Additionally, in a case where the substrate for mounting an electronic component A that has a via conductor 2 and a conductor pattern 3 is created on at least one of an inside and a surface thereof, the green sheet 11 where the via conductor 2 and the conductor pattern 3 are preliminarily formed on at least one of an inside and a surface of the green sheet 11 may be used.

Then, the created molded body 10 is fired (a maximum temperature: 1500 to 1900° C.) so as to obtain the substrate for mounting an electronic component A.

In a case where the light-emitting device E is fabricated, a dam part 5 is molded by using a die with a different shape and firing is executed integrally with the molded body 10, so that it is possible to obtain it.

Although an embodiment(s) of the present disclosure has/have been explained above, the present disclosure is not limited to the embodiment(s) as described above and a variety of modifications are possible without departing from a spirit thereof. Practical Examples Substrates for mounting an electronic component where a first surface 1a of a base 1 was sloped relative to a second surface 1b that was opposed thereto were created and laser diodes as electronic components were mounted thereon, so that electrical devices with sample numbers 1 to 5 (that may simply be referred to as samples 1 to 5 below) were fabricated. In samples 1 to 5, whereas all of shapes of bases 1 were identical, arrangements of respective via conductors 2 on the bases 1 were different. A manufacturing method for samples 1 to 5 will be illustrated below.

First, a mixed powder where 5% by mass of a yttria powder and 1% by mass of a calcia powder were mixed into 94% by mass of an aluminum nitride powder in such a proportion was prepared as a mixed powder for forming a green sheet 11.

Then, 20 parts by mass of an acrylic binder as an organic binder and 50 parts by mass of toluene were added to 100 parts by mass of such a mixed powder so as to prepare a slurry, and then, the green sheet 11 with a predetermined thickness was fabricated by using a doctor blade method.

Then, an acrylic organic binder and terpineol were appropriately added to a mixed powder where a tungsten powder and an aluminum nitride powder were mixed at a ratio of 7:3 so as to prepare a conductor paste and a via conductor 2 and a conductor pattern 3 were formed on the green sheet 11 by using it.

Then, a molded body 10 was fabricated by a manufacturing method as illustrated in FIG. 8 or the like by using the green sheet 11 as described above.

Firing of the fabricated molded body 10 for 2 hours was executed on a condition that a maximum temperature was 1800° C. in a reducing atmosphere so as to fabricate a substrate for mounting an electronic component.

A shape of each of the fabricated substrate for mounting an electronic component after firing thereof was of a length of 4 mm×a width of 3 mm and the first surface 1a of the base 1 was sloped relative to the second surface 1b that was opposed thereto in a longitudinal direction thereof. A slope angle of the first surface 1a relative to the second surface 1b was set at about 15°. Heights thereof were 1 mm at a lowest point and 2 mm at a highest point and average heights as described previously were 1.5 mm for a whole of the base 1, 1.25 mm for a lower part 1L, and 1.75 mm for a higher part 1H.

A diameter of the via conductor 2 after firing thereof was 0.1 mm and a void fraction thereof was 10%.

Then, a laser diode was packaged on a central part of the first surface 1a of the fabricated substrate for mounting an electronic component. Herein, Au—Sn solder was used for bonding of an electronic component to the first surface 1a.

Thus, samples 1 to 5 were fabricated.

Then, for each of fabricated samples 1 to 5, electricity was supplied from an outside other than such a substrate and thermal transient analysis was executed, so that a thermal resistance thereof was measured. Herein, the number of samples was provided as n=5 for each structure.

Subsequently, a substrate for mounting an electronic component that was identical to one used for creation of samples 1 to 5 was divided into a lower part 1L and a higher part 1H by dicing. Then, for each of them, a laser diode was packaged, electricity was supplied from an outside other than such a substrate, and thermal transient analysis was executed again, so that thermal resistances of the lower part 1L and the higher part 1H were measured.

Then, in order to measure a thermal conductivity of each of a base body 6 and the via conductor 2 in each of fabricated samples 1 to 5, a sample base body and a sample via conductor were fabricated in a composition and on a firing condition that were similar to those described above. A sample base body and a sample via conductor were of a circularly cylindrical shape with a diameter of 10 mm and a thickness of 1 mm. As thermal conductivities of a fabricated sample base body and sample via conductor were measured by using a laser flash method, 170 W/m·K and 100 W/m·K were provided respectively.

Table 1 illustrates a result of evaluation of a thermal resistance of each structure. Table 1 illustrates values of thermal resistances per unit height where measured thermal resistances are divided by respective average heights. As a thermal resistance per unit height is decreased, a thermal conductivity is increased. Additionally, average heights of the base 1, the lower part 1L, and the higher part 1H are provided as 1.5 mm, 1.25 mm, and 1.75 mm, respectively.

Furthermore, a distance from an electronic component to a via conductor in Table 1 is a distance that connects a center of the first surface 1a and a center of a cross section of the via conductor 2 along the first surface 1a of the base 1.

TABLE 1

| Sample number | Number of a via conductor(s) on a lower part (number) | Number of a via conductor(s) on a higher part (number) | Distance from an electronic component to a via conductor (mm) | Thermal resistance per unit height (K/W · mm) | | |
|---|---|---|---|---|---|---|
| | | | | Lower part | Higher part | whole |
| 1 | 0 | 2 | 0.5 | 12 | 24 | 15 |
| 2 | 0 | 2 | 1.0 | 12 | 20 | 14 |
| 3 | 0 | 2 | 2.0 | 12 | 16 | 13 |
| 4 | 2 | 0 | 0.5 | 31 | 12 | 25 |
| 5 | 1 | 1 | 0.5 | 22 | 18 | 20 |

From a result of measurement for sample numbers 1, 4, and 5 in Table 1, it is found that a thermal conductivity of a whole of the base 1 is increased as a thermal conductivity of the lower part 1L is increased (a thermal conductivity is increased as a thermal resistance per unit height is decreased), in a case where it is possible to increase a thermal conductivity of the lower part 1L or the higher part 1H selectively.

Similarly, from a result of measurement for sample numbers 1, 4, and 5, it is found that a thermal conductivity of a whole of the base 1 is increased as a number of the via conductor(s) 2 that is/are arranged on the lower part 1L relative to that of the higher part 1H is decreased (as a volume thereof is decreased).

Furthermore, from a result of measurement for sample numbers 1 to 3, it is found that a thermal conductivity of a whole of the base 1 is increased as a distance between the via conductor(s) 2 and an electronic component that is a heat source is increased.

REFERENCE SIGNS LIST

A to D substrate for mounting an electronic component
E light-emitting device
1 base
1a first surface (of a base)
1b second surface (of a base)
1c side surface (of a base)
1L lower part (of a base)
1H higher part (of a base)
2 via conductor
3 conductor pattern
4 light-emitting element
4a light-emitting surface (of a light-emitting element)
5 dam part
5a opening (of a dam part)
6 base body
10 molded body
11 green sheet
12 press die

The invention claimed is:

1. A substrate for mounting an electronic component, comprising
a base that is plate-shaped, wherein:
a first surface of the base is sloped relative to a second surface that is opposed to the first surface,
when the base is bisected in a slope direction into a lower part and a higher part, a thermal conductivity of the lower part is higher than a thermal conductivity of the higher part,
the base contains a first material and a second material with a thermal conductivity that is lower than that of the first material, and
a content of the second material in the lower part is less than a content of the second material in the higher part.

2. An electrical device, comprising:
the substrate for mounting an electronic component according to claim 1; and
an electronic component that is mounted on the first surface.

3. A light-emitting device, comprising:
the substrate for mounting an electronic component according to claim 1; and
a light-emitting element that is mounted on the first surface, wherein
the substrate for mounting an electronic component has a dam part that surrounds the light-emitting element, and
the dam part has an opening that penetrates through the first surface in a plane direction.

4. A substrate for mounting an electronic component, comprising
a base that is plate-shaped, wherein:
a first surface of the base is sloped relative to a second surface that is opposed to the first surface,
when the base is bisected in a slope direction into a lower part and a higher part, a thermal conductivity of the lower part is higher than a thermal conductivity of the higher part,
the base has a base body and a via conductor,
a thermal conductivity of the via conductor is lower than a thermal conductivity of the base body, and
a volume of the via conductor that is arranged on the lower part is less than a volume of the via conductor that is arranged on the higher part.

5. The substrate for mounting an electronic component according to claim 4, wherein
the via conductor is arranged on only the higher part.

6. The substrate for mounting an electronic component according to claim 4, wherein
the via conductor is arranged on only a peripheral part of the base in a plan view.

7. The substrate for mounting an electronic component according to claim 4, wherein
the via conductor is arranged on only a corner part of the base in a plan view.

8. The substrate for mounting an electronic component according to claim 4, wherein:
the base has a conductor pattern on the first surface; and
the via conductor is connected to the conductor pattern on only a peripheral part of the conductor pattern in a plan view.

9. The substrate for mounting an electronic component according to claim 4, wherein:
the base has a conductor pattern on the first surface; and
the via conductor is connected to the conductor pattern on only a corner part of the conductor pattern in a plan view.

10. An electrical device, comprising:
the substrate for mounting an electronic component according to claim 4; and
an electronic component that is mounted on the first surface.

11. A light-emitting device, comprising:
the substrate for mounting an electronic component according to claim 4; and
a light-emitting element that is mounted on the first surface, wherein
the substrate for mounting an electronic component has a dam part that surrounds the light-emitting element, and
the dam part has an opening that penetrates through the first surface in a plane direction.

12. A substrate for mounting an electronic component, comprising
a base that is plate-shaped, wherein:
a first surface of the base is sloped relative to a second surface that is opposed to the first surface,
when the base is bisected in a slope direction into a lower part and a higher part, a thermal conductivity of the lower part is higher than a thermal conductivity of the higher part,
the base has a base body and a via conductor,
a thermal conductivity of the via conductor is lower than a thermal conductivity of the base body, and
a number of the via conductor that is arranged on the lower part is less than a number of the via conductor that is arranged on the higher part.

13. The substrate for mounting an electronic component according to claim 12, wherein
the via conductor is arranged on only the higher part.

14. The substrate for mounting an electronic component according to claim 12, wherein
the via conductor is arranged on only a peripheral part of the base in a plan view.

15. The substrate for mounting an electronic component according to claim 12, wherein
the via conductor is arranged on only a corner part of the base in a plan view.

16. The substrate for mounting an electronic component according to claim 12, wherein:
the base includes a conductor pattern on the first surface; and
the via conductor is connected to the conductor pattern on only a peripheral part of the conductor pattern in a plan view.

17. The substrate for mounting an electronic component according to claim 12, wherein:
the base has a conductor pattern on the first surface; and
the via conductor is connected to the conductor pattern on only a corner part of the conductor pattern in a plan view.

18. An electrical device, comprising:
the substrate for mounting an electronic component according to claim 12; and
an electronic component that is mounted on the first surface.

19. A light-emitting device, comprising:
the substrate for mounting an electronic component according to claim 12; and
a light-emitting element that is mounted on the first surface, wherein
the substrate for mounting an electronic component has a dam part that surrounds the light-emitting element, and
the dam part has an opening that penetrates through the first surface in a plane direction.

* * * * *